United States Patent [19]
Ishihara et al.

[11] Patent Number: 5,888,410
[45] Date of Patent: Mar. 30, 1999

[54] DRY ETCHING METHOD AND MANUFACTURING METHOD OF MANUFACTURING EL ELEMENT USING SAME

[75] Inventors: Hajime Ishihara, Nagoya; Kazuhiro Inoguchi, Toyota; Yutaka Hattori, Okazaki; Nobuei Ito, Chiryu; Tadashi Hattori, Okazaki, all of Japan

[73] Assignee: Denso Corporation, Kariya, Japan

[21] Appl. No.: 825,579

[22] Filed: Mar. 31, 1997

[30] Foreign Application Priority Data

Apr. 1, 1996 [JP] Japan .................................. 8-079134
Nov. 15, 1996 [JP] Japan .................................. 8-305079

[51] Int. Cl.$^6$ ........................................................ B44C 1/22
[52] U.S. Cl. .................................. 216/5; 216/67; 216/76; 438/722; 252/79.1
[58] Field of Search ................................ 216/5, 24, 25, 216/33, 41, 67, 76; 438/710, 722; 252/79.1

[56] References Cited

U.S. PATENT DOCUMENTS

| | | |
|---|---|---|
| 4,925,813 | 5/1990 | Autier et al. . |
| 5,110,410 | 5/1992 | Elkind . |
| 5,171,401 | 12/1992 | Rosselle . |
| 5,230,771 | 7/1993 | Roselle . |
| 5,300,452 | 4/1994 | Chang et al. . |
| 5,304,283 | 4/1994 | Boudama . |

FOREIGN PATENT DOCUMENTS

| | | |
|---|---|---|
| 64-063292 | 3/1989 | Japan . |
| 1-200594 | 8/1989 | Japan . |
| 1-217884 | 8/1989 | Japan . |
| 2-018894 | 1/1990 | Japan . |
| 3-139838 | 6/1991 | Japan . |
| 5-234958 | 9/1993 | Japan . |
| 6-045291 | 2/1994 | Japan . |
| 6-268262 | 9/1994 | Japan . |
| 6-085352 | 10/1994 | Japan . |
| 7-050292 | 2/1995 | Japan . |
| 7-078804 | 3/1995 | Japan . |
| 92/00609 | 1/1992 | WIPO . |

OTHER PUBLICATIONS

Yamamoto et al: A 10–in.–Diagonal Multicolor Thin Film Electroluminescent (TFEL) Display Panel With 512 X 384 Pexels/Central Research Laboratory, Matsushita Electric Industrial Co., Ltd. Japan Display 1989—pp. 228–231.
Basis For Thin Film Formation/Published By Nikkan Kogyo Shinbun/ pp. 205–208 (See Abstract).

*Primary Examiner*—William Powell
*Attorney, Agent, or Firm*—Pillsbury Madison & Sutro LLP

[57] ABSTRACT

A dry etching method performing dry etching of a material containing zinc forms and patterns a resist on the material to be etched, and etches the material using an etching gas which is a mixed gas of methane gas and an inert gas. A dry etching method that dry etches a material containing zinc etches the material using an etching gas that consists only of methane gas, an inert gas, and hydrogen gas alone. Another dry etching method that dry etches a material containing zinc introduces an etching gas that contains methane gas, an inert gas, and hydrogen gas into a dry etching device, in which the flow rate of the hydrogen gas is set such that it is equal to or greater than the value at which the amount of dissociated hydrogen becomes saturated, and etches the material using the etching gas. An EL element manufacturing method forms a first luminescent material containing zinc in its composition on a first insulated layer, forms a first resist that has a first pattern on the first luminescent material, dry etches the first luminescent material through the first resist, thereby forming the first luminescent layer; forms a second luminescent material having zinc in its composition on the first luminescent layer, forms a second resist on the second luminescent material, and dry etches the second luminescent material through the second resist.

31 Claims, 8 Drawing Sheets

DRY ETCHING METHOD AND MANUFACTURING METHOD OF MANUFACTURING EL ELEMENT USING SAME

CROSS REFERENCE TO RELATED APPLICATION

The present invention is based upon and claims the benefit of priority of the prior Japanese Patent Applications No. Hei 8-79134 filed on Apr. 1, 1996 and No. Hei 8-305079 filed on Nov. 15, 1996, the content of which are incorporated herein by reference.

BACKGROUND OF THE INVENTION

1. Field of the Invention:

The present invention relates to a dry etching method of dry-etching a Zn (zinc)-containing material such as ZnS (zinc sulfide) that is used in a luminescent layer of an EL (Electroluminescent) element or ZnO (zinc oxide) that is used as a transparent electrode thereof, and a manufacturing method of manufacturing the EL element by using the same.

2. Related Arts:

Conventionally, chemical dry etchings are performed by causing an etching gas to react with a material to be etched and thereby changing this material to be etched into a material of which boiling point is lower than that of the material to be etched and of which saturation vapor pressure is higher than that thereof.

Here, if as a material to be etched there is used a Zn-containing material such as ZnS used in the luminescent layer of the EL element, the use of an etching gas that is employed ordinarily in chemical etchings raises the problem that the reaction product has such a high boiling point that the etching action can not be performed easily. For example, when using $Cl_2$ as the etching gas zinc chloride ($ZnCl_2$) is produced as the reaction product, the boiling point of this material is 732° C.

SUMMARY OF THE INVENTION

The present invention has been made in view of the above and has an object to facilitate performance of etching of a material to be etched that contains Zn.

A further object of the present invention is to enhance the etching rate in the above etching.

The present invention is characteristically directed to etching a material to be etched containing zinc by forming and patterning a resist on this material to be etched and then performing this etching with the use of a dry etching gas which is a mixed gas of $CH_4$ gas and inert gas and in which the percentage of the $CH_4$ gas in the mixed gas is in a range from 0.5% to 5% inclusive.

As a result of this, the etching can be easily performed by lowering the boiling point of an organic compound of zinc. Further, in this case, the chemical etching action can be made to proceed while keeping the surface of the material to be etched always refreshed by a physical etching action performed using the inert gas and thereby preventing the production of carbon compounds. As a result of this, the etching rate can be increased.

Particularly, if the percentage of the $CH_4$ gas has been made to range between 0.5% and 2% inclusive, it is possible to obtain a high etching rate.

Also, if during etching the high frequency power has been made to range between 0.25 W inclusive and 0.8 W per square centimeter, the difference in etching rate between the material to be etched and the resist can set to be a desired value. Therefore, the material to be etched can be etched selectively with respect to the resist.

Also, if the pressure of the etching gas has been made to range between 30 mTorr and 100 mTorr, inclusive, the difference in etching rate between the material to be etched and the resist can similarly set to be a desired value. Therefore, the material to be etched can be etched selectively with respect to the resist.

It is to be noted that a mixed gas which consists of only a $CH_4$ gas and an inert gas alone can be used. Also argon gas can be used as the inert gas.

When dry-etching a material that contains zinc, this material may be etched using an etching gas that consists of methane gas, inert gas and hydrogen gas.

It is possible to enhance the etching rate by mixing methane gas, inert gas and hydrogen gas.

Also, if an etching gas that consists of methane gas, inert gas and hydrogen gas is introduced into a dry etching device, whereby etching is performed with the flowrate of the hydrogen gas being set at not less than a value at which the amount of dissociated hydrogen becomes saturated, etching can be performed at a very high etching rate.

A material that consists mainly of ZnS or ZnO can be used as a material to be etched.

When manufacturing an EL element, the luminescent layer is etched by the use of the above-mentioned etching gas to perform patterning of it.

In this case, when laminating a first luminescent layer and second luminescent layer and etching the second luminescent layer by the use of the above-mentioned etching gas, patterning of the second luminescent layer can be performed without causing any damage to the underlying first luminescent layer.

When manufacturing an EL element wherein a second electrode is made of a material that consists mainly of ZnO, the second electrode is etched using the above-mentioned etching gas and patterning thereof is performed.

As a result of this, even when the luminescent layer is weak for water components and therefore wet etching of the second electrode cannot be performed, patterning of the second electrode can be properly performed by dry etching thereof.

As the luminescent layer that is weak for water components there is a luminescent layer that has been constructed of a material that consists mainly of a sulfide of an alkaline earth metal.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PREFERRED EMBODIMENTS

Before explaining the preferred embodiments, an explanation will now be given of the technical level of consideration that has been previously achieved.

The present inventors examined zinc compounds as reaction products that have a boiling point lower than that of ZnS and as a result have discovered that organic compounds of zinc have a lower boiling point. For this reason, they considered using a $CH_4$ (methane) gas, which has the smallest molecular weight in hydrocarbon gases, as the etching gas.

When using this $CH_4$ gas, dimethyl zinc ($Zn(CH_3)_2$) is produced. Dimethyl zinc has a boiling point of 46° C. Accordingly, it is possible to easily perform etching of a material containing Zn easily.

However, it has been proved that when etching ZnS using only a $CH_4$ gas alone, there is a problem in which no etching occurs.

On this account, when having performed AES (Auger Electron Spectroscopy) analysis of the ZnS surface in the mid-course of etching, C (carbon) has been detected from the ZnS surface. Accordingly, it is considered that the production of carbon compounds prevents etching from occuring. Therefore, if during chemical etching that uses a $CH_4$ gas it is arranged that no carbon compounds are produced, it is possible to cause etching to proceed.

Dry etching includes, in addition to the above-mentioned chemical etching, physical etching that uses an inert gas such as Ar (argon) gas. In this physical etching, Ar gas for example, is struck directly against a material to be etched to thereby perform etching thereof.

The present inventors have considered a combination of chemical etching that uses $CH_4$ gas and physical etching that uses Ar gas and considered, with the surface of the material to be etched being kept always refreshed by the physical etching that uses the Ar gas whereby the production of no carbon compounds is kept produced, the performance of the chemical etching.

Figure 7:
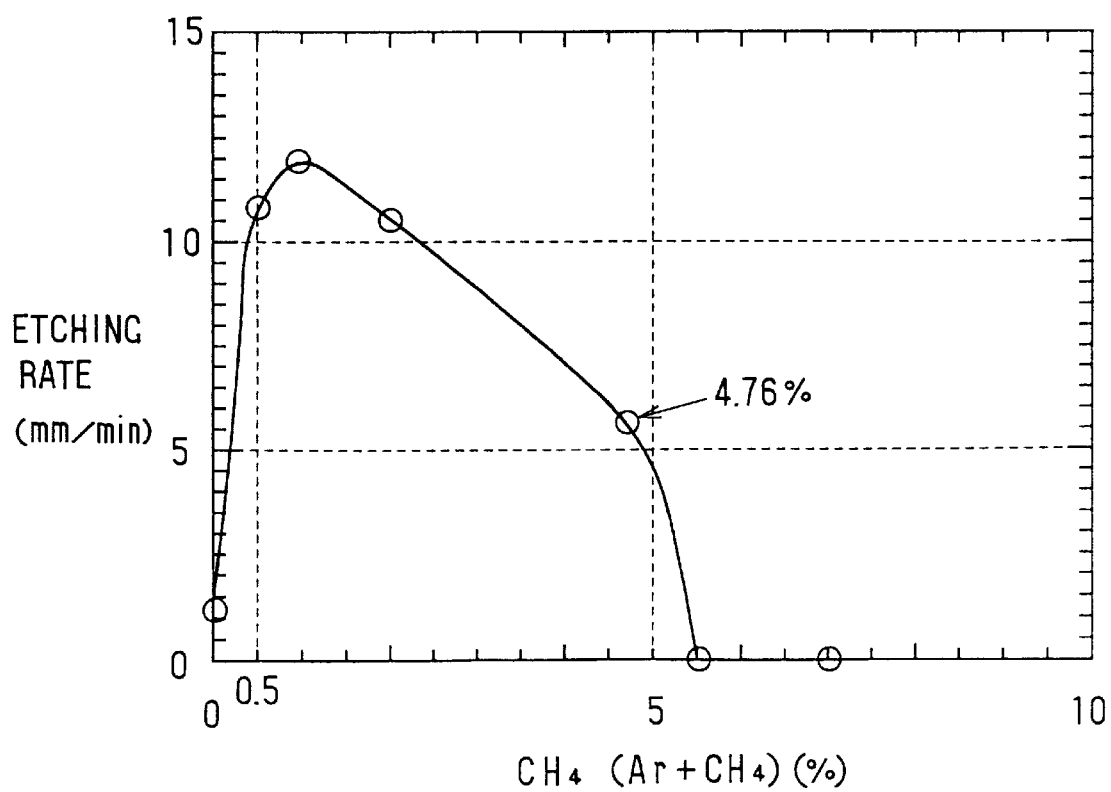
FIG. 7 is a graph illustrating a characteristic of variation in the etching rate as measured relative to the percentage of a $CH_4$ gas.

On this account, the present inventors patterned a resist (e.g., sypray S 1400-17) on the material to be etched and, while varying the percentage of the $CH_4$ gas in the mixed gas of the $CH_4$ gas and Ar gas, studied how the etching rate changed. The results are shown in FIG. 7. It is to be noted that as the material to be etched ZnS was used.

When the percentage of the $CH_4$ gas was made to be below 0.5%, the effect on the physical etching that used the Ar gas was great with the result that the etching rate became largely low and the resist was inconveniently etched. On the other hand, when the percentage of the $CH_4$ gas was made to be 5% or more, the etching did not proceed due to the production of carbon compounds. Particularly, when the percentage of the $CH_4$ gas is 5.5% or more, no etching whatsoever occurs.

Accordingly, if the percentage of the $CH_4$ gas is made to range between 0.5% and 5%, inclusive, the etching rate can be made to be high. Particularly, if the percentage thereof is made to range between 0.5% and 2% inclusive, an etching rate of 10 nm/min or more can be obtained.

It is to be noted that the results illustrated in FIG. 7 are those which have been experimentally obtained using a RIE (Reactive Ion Etching) device as the dry etching device and under the conditions of the gaseous pressure being 50 mTorr and the RF power being 0.625 W/cm$^2$. It is to be noted that even when these conditions are varied, the etching rate as measured with regard to the $CH_4$ gas percentage exhibits no substantial change.

Figure 8:
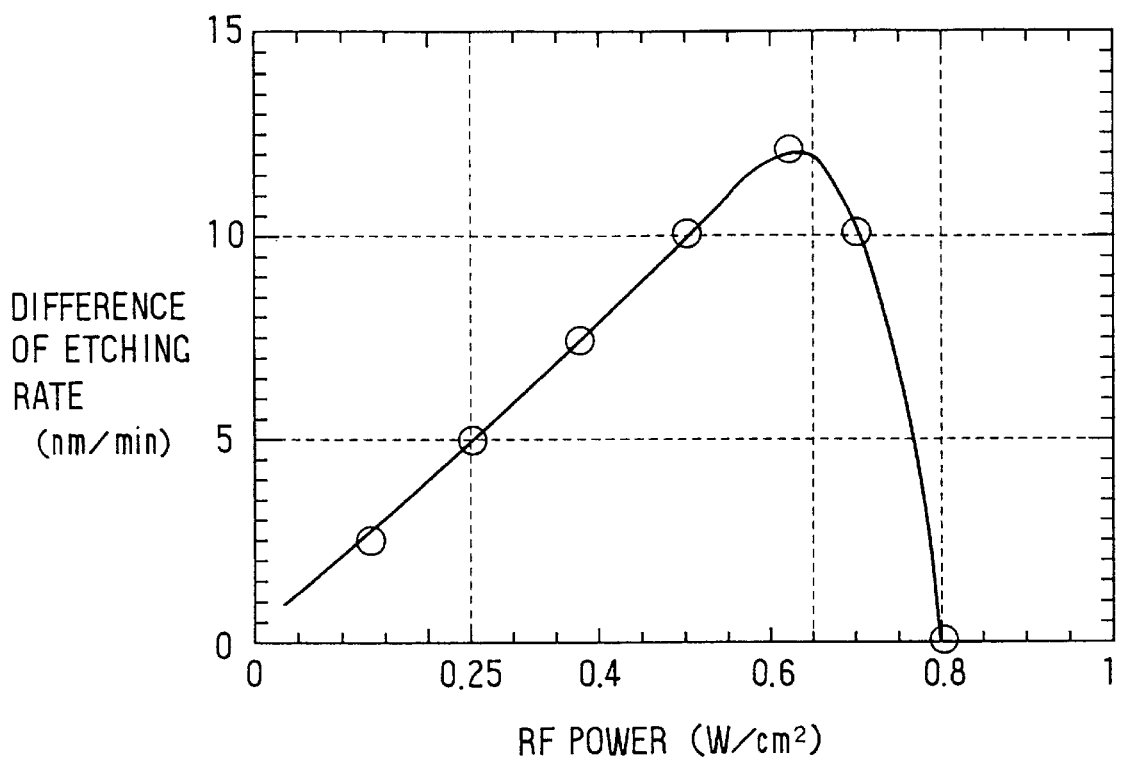
FIG. 8 is a graph illustrating a characteristic of variation in the difference in etching rate between the $CH_4$ gas and a resist as measured relative to an RF power.

Also, with the $CH_4$ gas percentage being set at approximately 1% and the gaseous pressure being set at 50 mTorr the present inventors have studied the difference in an etching rate between ZnS and a resist as measured with regard to the RF power. The results are shown in FIG. 8.

When the RF power is smaller than 0.65 W/cm$^2$ no resist whatsoever is etched, when the RF power is 0.65 W/cm$^2$ or more, the resist starts to be etched with the result that the difference in the etching rate becomes sharply small. When the RF power is set at 0.8 W/cm$^2$, both etching rates become substantially the same.

In order to perform selective etching of ZnS, it is needed to make the difference in etching rate larger than 0. Accordingly, the RF power should be made below 0.8 W/cm$^2$. Also, in order to ensure some degree of etching rate, the RF power preferably is made to be 0.25 W/cm$^2$ or more.

Also, with the $CH_4$ gas percentage being set at approximately 1% and the RF power being set at 0.625 W/cm$^2$, the present inventors have studied the difference in an etching rate between ZnS and a resist as measured with regard to the gaseous pressure. The results are shown in FIG. 9.

When making the gaseous pressure higher than 50 mTorr no etching whatsoever occurs in the resist, when making the gaseous pressure 50 mTorr or lower, the etching of the resist starts to be performed. In this case, when making the gaseous pressure to be not lower than 30 mTorr, the difference in an etching rate becomes larger than 0, with the result that selective etching of ZnS can be done. Also, in this case, in order to ensure some degree of etching rate, the gaseous pressure preferably is made to be 100 mTorr or lower.

Figure 9:
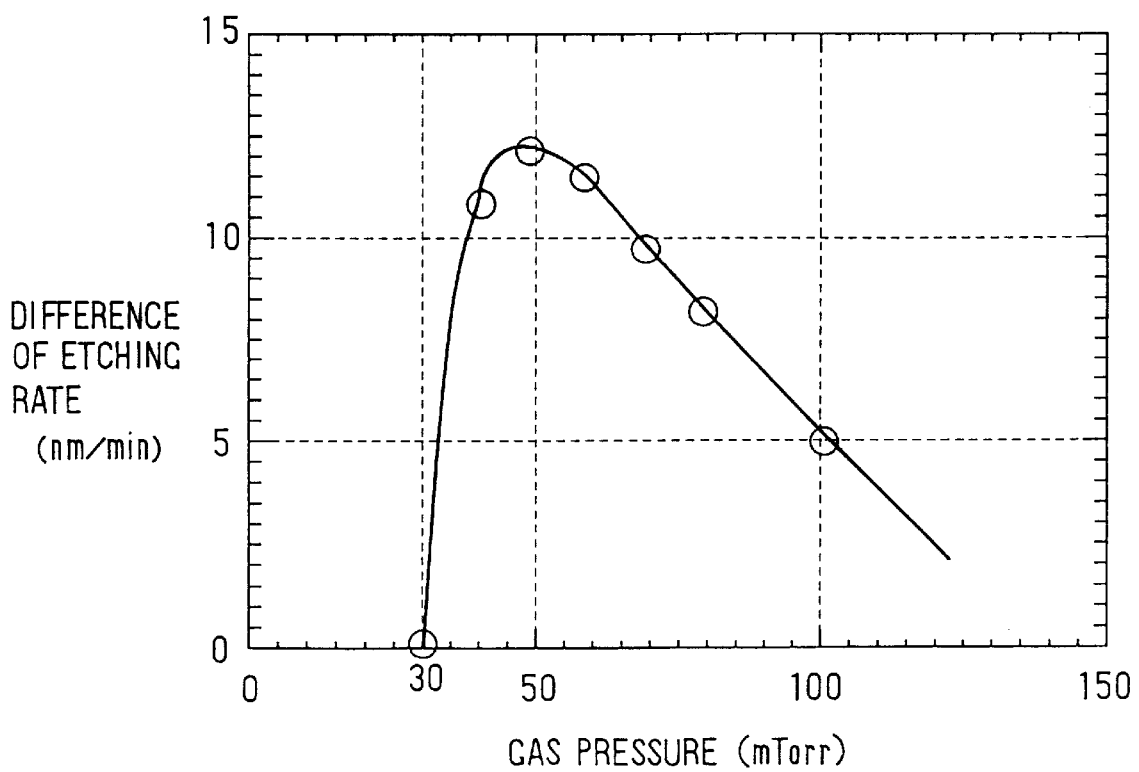
FIG. 9 is a graph illustrating a characteristic of variation in the difference in etching rate between the $CH_4$ gas and the resist as measured relative to a gas pressure.

Note that while the variation style of the etching rate difference illustrated in each of FIGS. 8 and 9 varies according to the $CH_4$ gas percentage, if the $CH_4$ gas Bee percentage is made to range between 0.5% and 2%, inclusive, the above-mentioned results can be satisfied substantially.

Also, the same results as mentioned above can be obtained with respect to even other materials to be etched such as ZnO than ZnS, each of which contains Zn. Also, etching can be performed without causing any damage to the underlying material which lies under the material to be etched such as $Si_3N_4$, SiON, $SiO_2$ or $Ta_2O_5$. Note that although in a case of performing only physical etching alone using Ar gas, the resist is damaged, but in the case of performing the above-mentioned etching, no damage is caused to the resist.

The present inventors proceeded with the above-mentioned studies and performed etching under the conditions of the $CH_4$ gas percentage being set at 5%, the gaseous pressure being set at 50 m Torr and the RF power being 0.625 $W/cm^2$ and performed XPS (X-Ray Electron Spectroscopy) analysis of the ZnS surface in mid course during the etching action.

Figure 10:
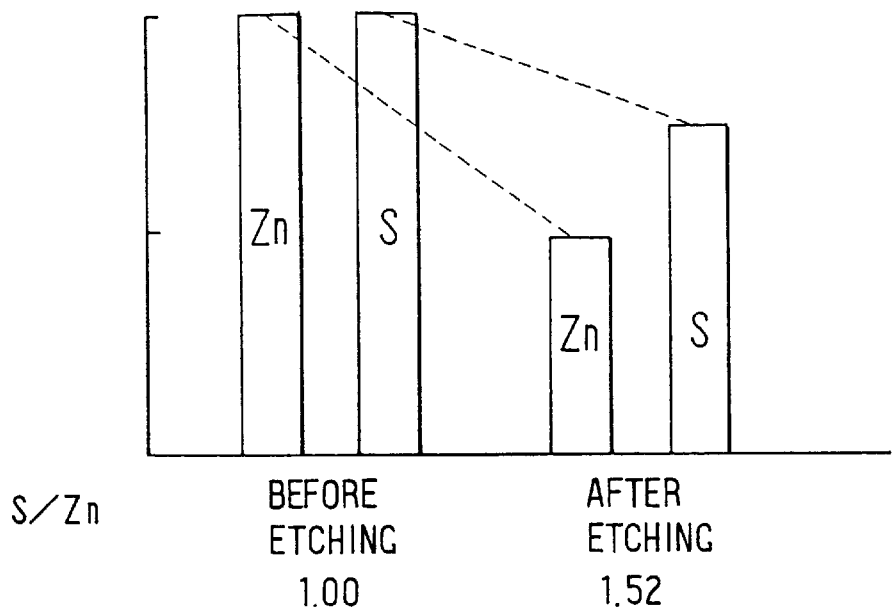
FIG. 10 is a graph illustrating the results of XPS analyses of the ZnS surface which were made before and after etching with the percentage of the $CH_4$ gas being set at 5%.

The results are shown in FIG. 10. It is understood from this graph that while before etching the ratio of S (sulfur) to Zn is 1.00, after etching S remains in a larger amount than Zn. That is, as a result of the reaction between ZnS and $CH_4$ a material of Zn $(CH_3)_2$ is produced, which proves that etching proceeds. However, the reaction that causes the production of $H_2S$ (hydrogen sulfide) which is another reaction product does not proceed. Accordingly, if the production of $H_2S$ is promoted and the production of carbon compounds is suppressed, it is considered that the etching rate can be further enhanced.

Figure 11:
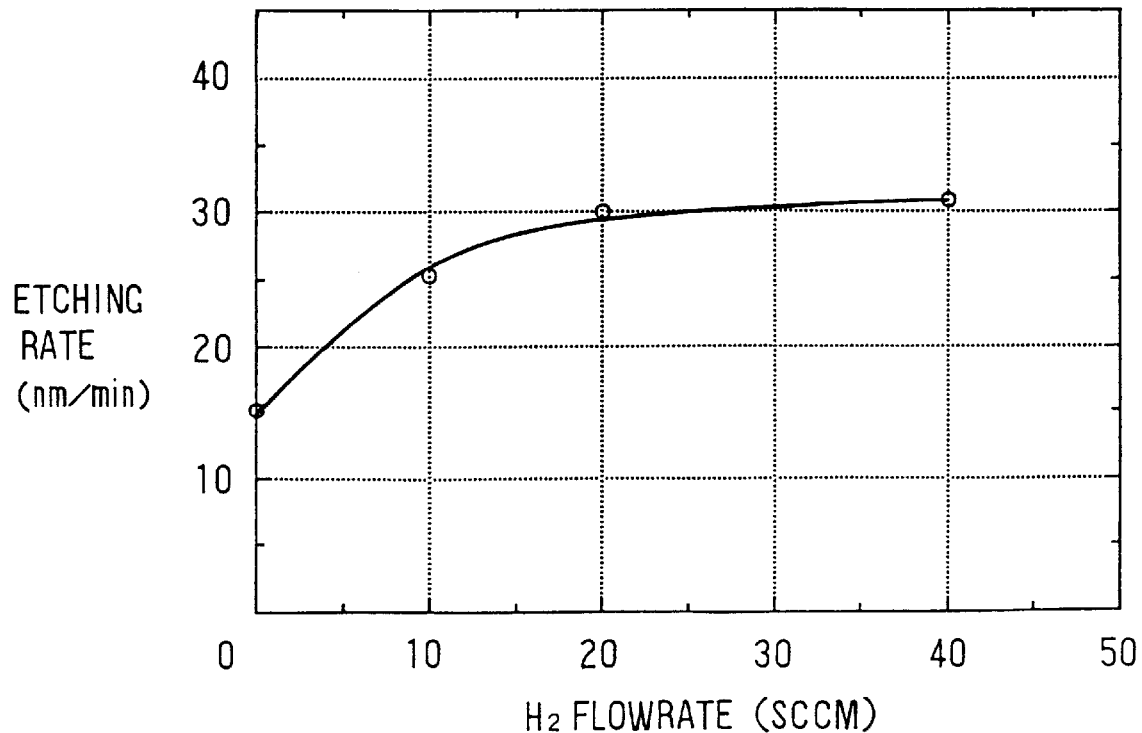
FIG. 11 is a graph illustrating a variation in etching rate obtained when the flowrate of $H_2$ was varied with a mixed gas of $CH_4$, Ar and $H_2$ used as the etching gas.

On this account, the present inventors attempted to further mix a $H_2$ (hydrogen) gas into a mixed gas of $CH_4$ and Ar gases. In FIG. 11 there is illustrated the variation in the etching rate that occurs when the flowrate of $H_2$ has been varied under the fixed conditions of the flowrate of $CH_4$ being 2 sccm and the flowrate of Ar being 200 sccm. As the flowrate of $H_2$ increases, the etching rate increases with the result that an etching rate of 30 nm/min or more can be obtained.

The reason for this is considered to be that by causing the flow of the $H_2$ gas the dissociated hydrogen (H radical) therefrom reacts with ZnS to thereby promote the production of $H_2S$; and also the $CH_3$ radicals that have been dissociated from the $CH_4$ and the above dissociated hydrogen react with each other to thereby produce $CH_4$, which suppresses the production of carbon compounds due to the reaction between the dissociated $CH_3$ radicals. Also, the dissociated hydrogen and the carbon compounds react with each other to thereby produce $CH_4$ and thereby decrease the amount of carbon compounds, i.e., these carbon compounds are etched by the dissociated hydrogen. This fact also is considered to contribute toward suppressing the production of the carbon compounds.

It is to be noted that in FIG. 11, when the flowrate of $H_2$ has been set at 20 sccm or more (the percentage thereof to the total amount of gas is approximately 9%), the etching rate becomes saturated. This is because the amount of dissociated hydrogen is not in proportion to the flowrate of $H_2$. If the flowrate of $H_2$ is set at a flowrate that is not smaller than a value (approximately 9% in FIG. 11) at which the amount of dissociated hydrogen becomes saturated, it is possible to obtain a higher etching rate.

The effect that is attainable with the above-mentioned addition of the $H_2$ gas can also be obtained even when the percentage of $CH_4$ gas, the gaseous pressure and RF power have each been varied, provided, however, that since when increasing the percentage of $CH_4$ gas with the flowrate of $H_2$ being kept fixed, the production of carbon compounds cannot be sufficiently suppressed, and etching rate drops.

Note that a dry etching method which is used when a material to be etched contains Zn therein is described in Japanese Patent Application Laid-Open Publication No. 5-23495. In this method, a mixed gas of $C_2H_6$ (ethane) and $H_2$ (hydrogen) is used as the etching gas. In this case, etching is performed for the purpose of machining a resonator mirror of a semiconductor laser or a stripe structure of the waveguide passage and it is described that when using $C_2H_6$, the etching rate becomes low because of the molecular weight thereof being large, with the result that the machinability is enhanced.

Accordingly, when as in the case of etching ZnS that is used in the EL element a high rate of etching is needed, it is impossible to use the etching gas that is disclosed in the above Publication.

Also, in a convention technique described in the description column of the above Publication, an etching method that uses a mixed gas of $CH_4$ and $H_2$ is disclosed. However, since it is impossible to perform such a physical etching as in the case of the present invention with $H_2$, it is impossible to obtain a sufficiently high rate of etching. Actually, the present inventors have conducted their experiments of performing etching with respect to a ZnS:TbOF luminescent layer having a host material of ZnS and a luminescent center of TbOF by using only a mixed gas of $CH_4$ and $H_2$ alone, and have made their studies on the matter by XPS analysis that has been performed before and after etching.

Figure 12A:
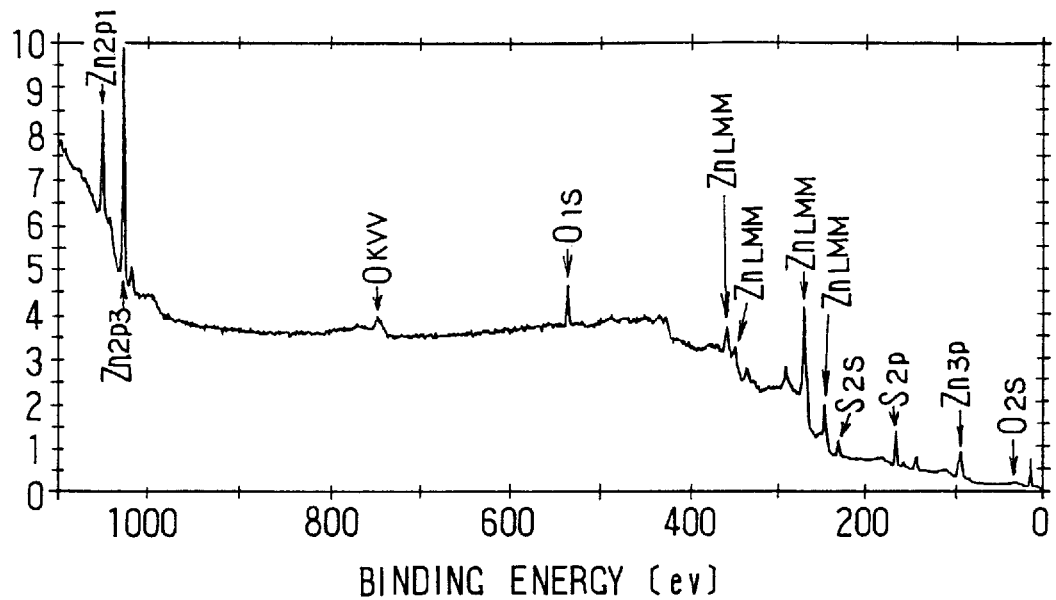
FIGS. 12A and 12B are graphs illustrating the results of the XPS analyses that were made before and after etching when a luminescent layer of ZnS:TbOF was etched using only a mixed gas of $CH_4$ and $H_2$ alone.
Figure 12B:
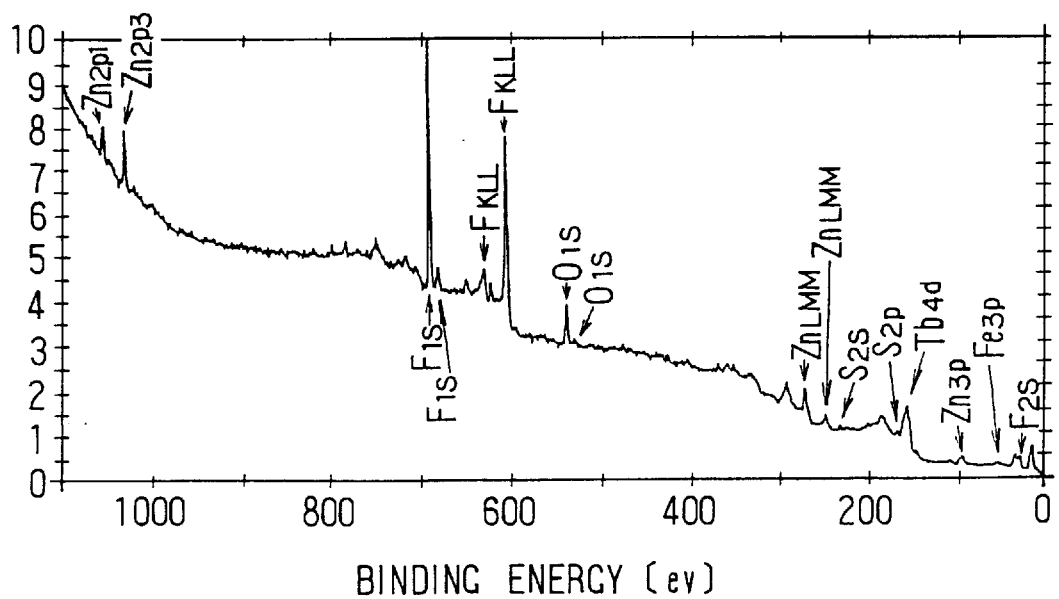

FIG. 12A illustrates the results of an analysis that has been made before etching, and FIG. 12B illustrates the results of analysis that has been made after etching. From these graphs, it is understood that, after etching, almost no Zn and S are observed on the surface of the luminescent layer, the most part of which is occupied by Tb and F. Namely, when using $CH_4$ gas as the etching gas, ZnS can be etched but TbOF cannot be etched. Accordingly, it is understood that since the Ar gas that is mixed into the etching gas as in the present invention acts as an agent of physical etching, the Ar gas not only serves to remove carbon compounds but also provides an advantage of removing the luminescent center (TbOF) of the luminescent layer of the EL element.

Also, as another similar technique, on page 229 of JAPAN DISPLAY' 89, there is described a technique that uses a mixed gas of $CH_3OH$ (methanol) and Ar gas in order to etch ZnS. However, since $CH_3OH$ is not gaseous at normal temperature, when using it, it is needed to introduce after bubbling or the like. Therefore, it becomes disadvantageous for controlling the amount and percentage of it as well as for reduction in cost of it, with the result that etching cannot be performed easily.

Preferred embodiments of the present invention will now be explained.

First Embodiment

Figure 1:
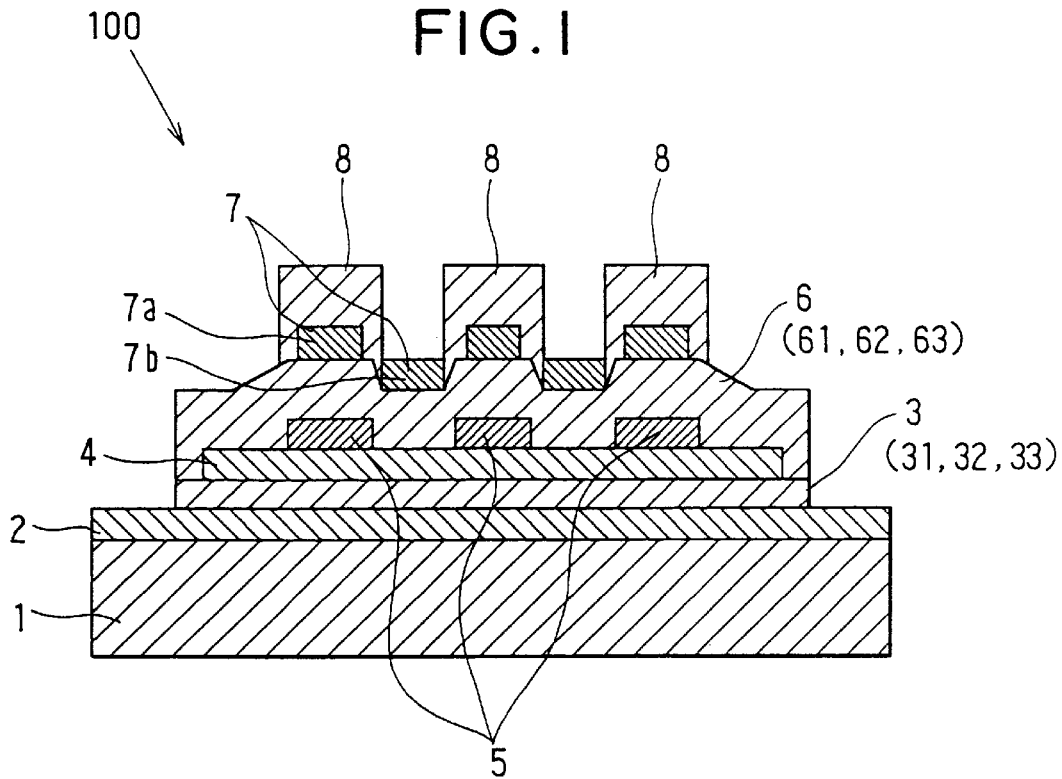
FIG. 1 is a typical sectional view illustrating an EL element according to a first embodiment of the present invention.
Figure 2:
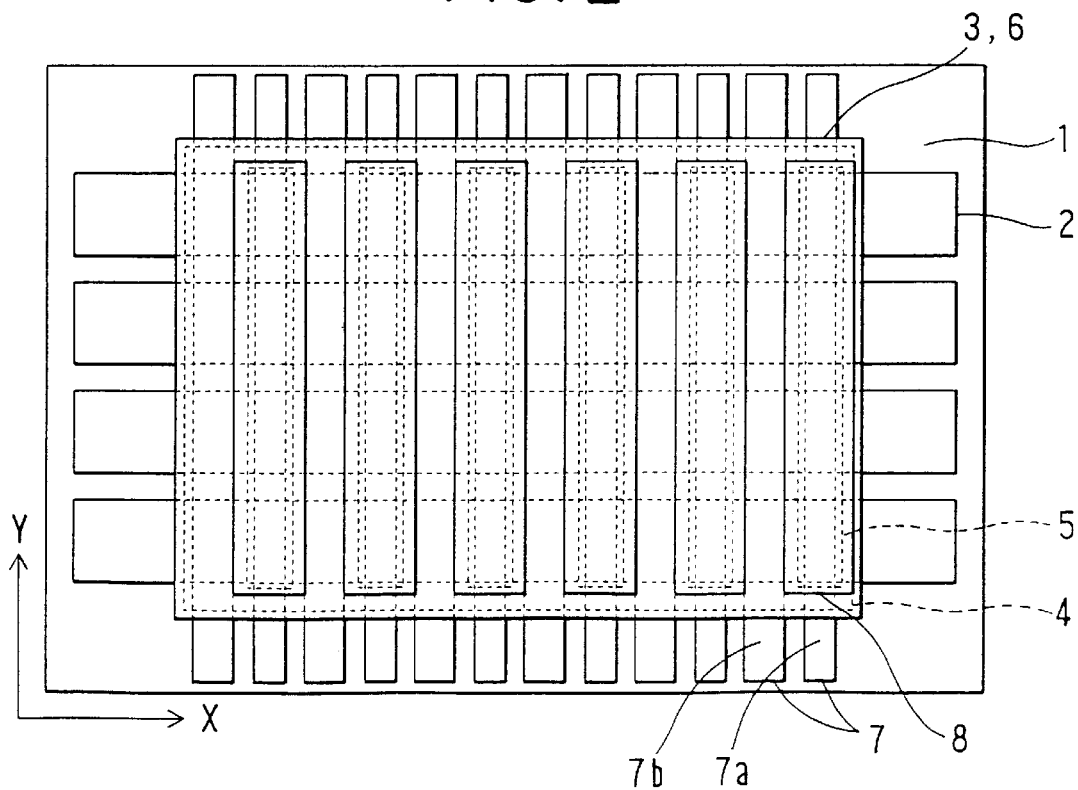
FIG. 2 is a plan view illustrating arrangements of first and second electrodes of the EL element according to the first embodiment.

FIG. 1 is a typical view illustrating a longitudinal section of an EL element according to a first embodiment of the present invention and FIG. 2 is a plan view thereof.

The EL element 100 has the following thin films sequentially formed on a glass substrate in such a way as to be laminated thereon.

On the glass substrate 1, a first electrode 2 which consists of a metal reflection film made of Ta (tantalum) and which has a thickness of 2000 Å is formed. As illustrated in FIG. 2, this first electrode 2 is formed such that a number of strips, each extending in the x-axial direction, are provided in the y-axial direction.

On the glass substrate 1 having the first electrodes 2 formed thereon, there is formed uniformly a first insulating layer 3. This first insulating layer 3 consists of two layers. One layer is a first insulating lower layer 31 which consists of an optically transparent $SiO_xN_y$ (silicon oxide nitride) and which has a thickness of 500 to 1000 Å. The other is a first insulating upper layer 32 which consists of a composite film $Ta_2O_5$: $Al_2O_3$ of $Ta_2O_5$ (tantalum oxide) and $Al_2O_3$ (aluminum oxide) and which has a thickness of 2000 to 3000Å.

On the first insulating upper layer 32, there are formed a first luminescent layer 4 having a thickness of 5000 Å and a second luminescent layer 5 having a thickness of 2000 Å. As illustrated in FIG. 2, the second luminescent layer 5 is formed such that a number of strips, each extending in the y-axial direction, are provided at predetermined space intervals in the x-axial direction.

The first luminescent layer 4 consists of ZnS having TbOF (telubium oxide fluoride) added thereto and has a thickness of 5000 Å. On this first luminescent layer 4 there is formed the patterned second luminescent layer 5 to a thickness of 2000 Å. The second luminescent layer 5 is formed of ZnS having Mn added thereto.

On the first luminescent layer 4 and second luminescent layer 5 there is formed a second insulating layer 6 uniformly. This second insulating layer 6 consists of three layers. A first one is a second insulating lower layer 61 that consists of an optically transparent $Si_3N_4$ (silicon nitride) and that has a thickness of 1000 Å. A second one is a second insulating intermediate layer 62 that consists of a composite film of $Ta_2O_5$ and $Al_2O_3$ and that has a thickness of 2000 Å. And a third one is a second insulating upper layer 63 that consists of $SiO_xN_y$ and that has a thickness of 1000 Å.

On the second insulating upper layer 63, there are formed second electrodes 7 each of which consists of optically transparent ZnO and $Ga_2O_3$ (gallium oxide) and which has a thickness of 4500 Å. As illustrated in FIG. 2, the second electrodes 7 are formed such that a number of strips, each extending in the y-axial direction, are provided in the x-axial direction.

On the second electrodes 7, there are formed, red color filters 8 each of which is made of resin and has a thickness of 1.0 to 2.0 μm, at regions having the second luminescent layers 5 thereunder. The red color filters 8 are strips which extend in the y-axial direction and which have been formed on the second electrode 7 illustrated in FIG. 2 by having its area enlarged in such a manner as to cover the second electrodes arranged in correspondence to and in parallel with the red color filters 8. Each of these red color filters 8 transmit therethrough a light which has been emitted from a portion where the first luminescent layer 4 overlaps upon the second luminescent layer 5.

Next, a manufacturing method of manufacturing the above-mentioned EL element 100 will now be explained. FIGS. 3A to 3C and 4A to 4C are plan views illustrating the manufacturing method thereof.

Figure 3A:
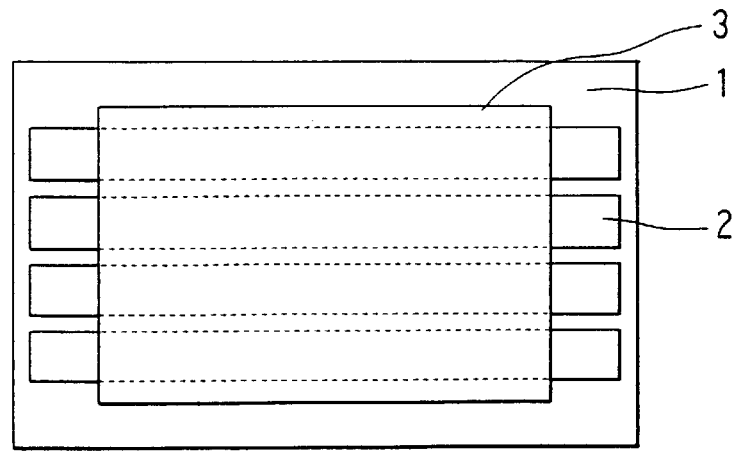
FIGS. 3A to 3C are plan views illustrating a manufacturing method of manufacturing the EL element according to the first embodiment.

After DC sputtering of Ta metal has been performed on the glass substrate 1, as illustrated in FIG. 3A, etching thereof is performed to the strip configuration to thereby form the first electrode 2 consisting of a metal reflection film.

Next, using a sputtering method, formation is performed of the first insulating lower layer 31 that consists of $SiO_xN_y$ and the first insulating upper layer 32 that consists of $Ta_2O_5$ containing $Al_2O_3$ of 6 wt %. Specifically, the temperature of the glass substrate 1 is maintained at 300° C. A mixed gas of Ar, $N_2$ (nitrogen) and a small amount of $O_2$ (oxygen) are introduced into the sputtering device. The gaseous pressure is maintained at 0.5 Pa. The high frequency power is set at 3 KW, and silicon is used as a target. Whereby, a film of $SiO_xN_y$ is formed. Subsequently, the composite film of $Ta_2O_5$ and $Al_2O_3$ is formed under the conditions that Ar and $O_2$ are used as the sputtering gases; the gaseous pressure is maintained at 0.6 Pa; use is made of a mixed sintered target that has $Ta_2O_5$ having added thereto $Al_2O_3$ of 6 wt %; and the high frequency power is set at 4 KW.

Figure 3B:
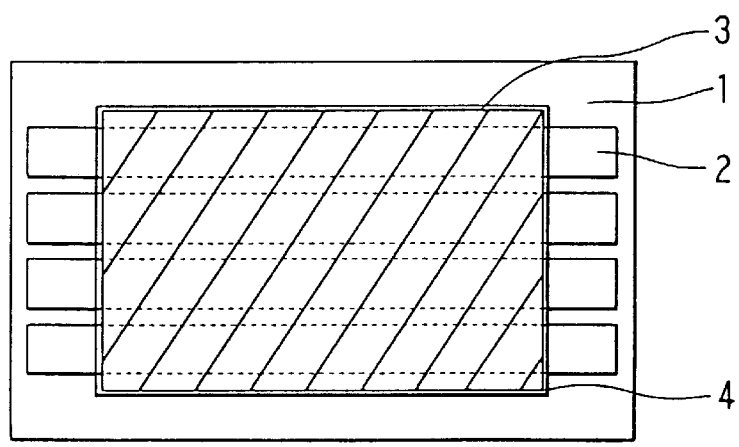

Next, as illustrated in FIG. 3B, on the first insulating upper layer 32 there is formed uniformly the first luminescent layer 4 which consists of a material of ZnS:TbOF that uses ZnS as the host material and has TbOF added thereto as the luminescent center. Specifically, formation of the film is performed under the conditions that the temperature of the glass substrate 1 is maintained at 250° C.; Ar and He (helium) are used as the sputtering gases; the gaseous pressure is 3.0 Pa; and the high frequency power is set at 2.2 KW.

Next, on the first luminescent layer 4, there is formed uniformly by evaporation a layer of ZnS:Mn that uses ZnS as the host material and has Mn added thereto as the luminescent center. Specifically, electron beam evaporation is performed under the conditions that the temperature of the glass substrate 1 is kept fixed; the interior of the evaporation device is maintained at $5 \times 10^{-4}$ Pa or less; and the deposition rate is from 0.1 to 0.3 nm/sec.

Figure 3C:
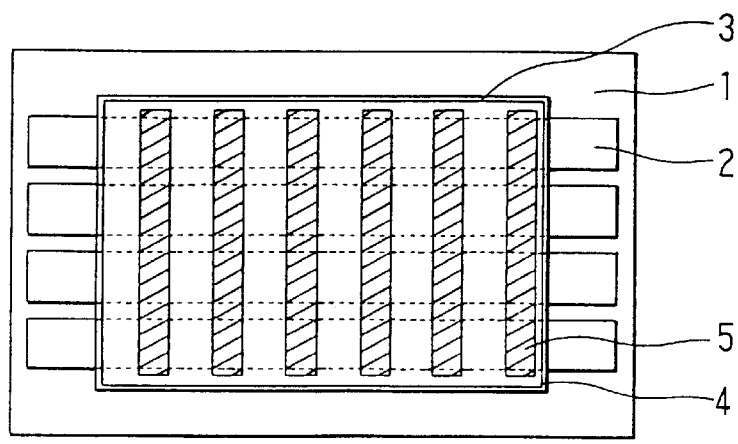

Next, this ZnS:Mn layer is dry-etched whereby the second luminescent layers 5 illustrated in FIG. 3C are formed. The method of forming these second luminescent layers 5 is explained using a sectional structure illustrated in FIGS. 5A and 5B.

Figure 5A:
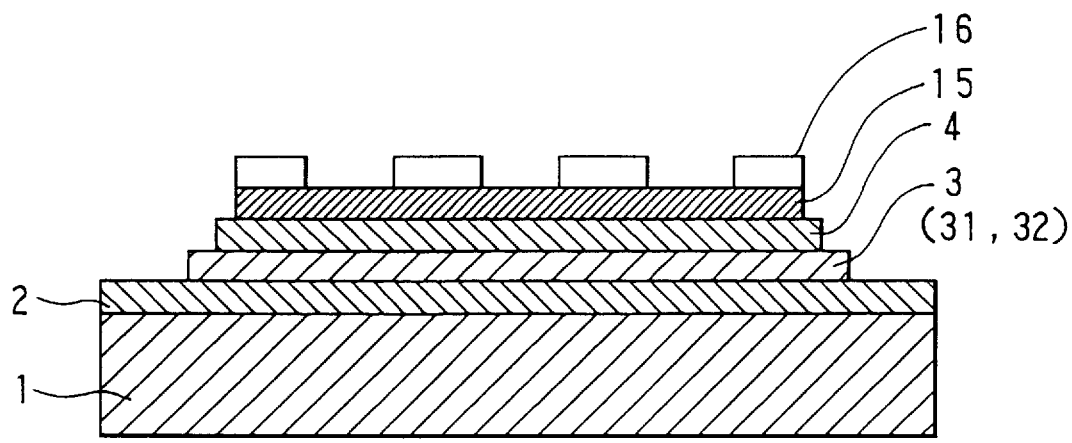
FIGS. 5A and 5B are typical sectional views illustrating dry etching of a second luminescent layer according to the first embodiment.
Figure 5B:
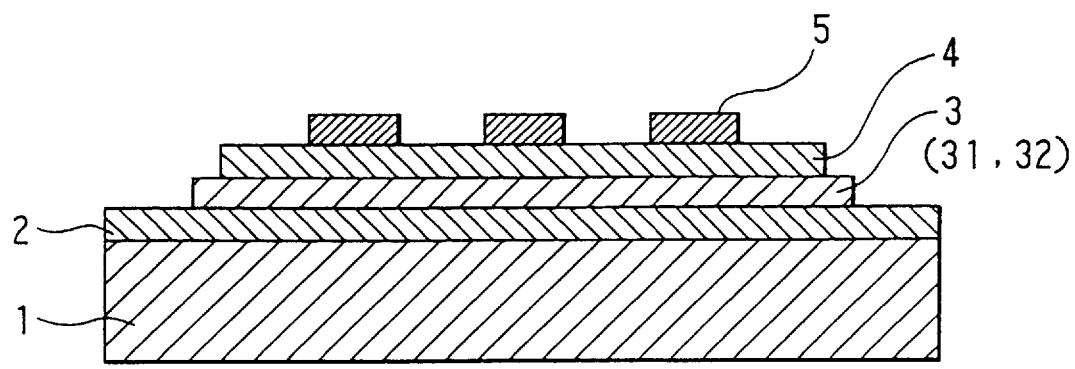

First, on the layer 15, that consists of the above-mentioned ZnS:Mn, a posi-type resist 16 is formed and then exposure and development are performed of it to thereby perform patterning with respect to the resist 16. Thus, a structure illustrated in FIG. 5A is obtained. In this state, dry etching is performed. Specifically, dry etching is performed by maintaining the temperature of the glass substrate 1 at 70° C., introducing a mixed gas of $CH_4$ and Ar gases into a RIE device, maintaining the pressure at 7 Pa and using a high frequency power of 0.625 W/cm². Thereafter, the resist 16 is removed to thereby obtain the second luminescent layer 5 that is shaped as illustrated in FIG. 5B.

Note that, in this embodiment, the percentage of $CH_4$ gas to a total amount of $CH_4$ gas and Ar gas is determined according to the ratio between the flowrate of Ar gas and the flowrate of $CH_4$ gas. That is, with the flowrate of Ar gas being set at 200 sccm and the flowrate of $CH_4$ gas being set at 2 sccm, the proportion of $CH_4$ gas is set at approximately 1%.

Here, by using as the etching gas a mixed gas of $CH_4$ w and Ar gases, the surface of the layer 15 consisting of ZnS Mn is changed to a low boiling point Zn $(CH_3)_2$ (dimethyl zinc) which in turn is vaporized while, on the other hand, physical etching is done with the use of the Ar gas. Accordingly, since the surface that has been always refreshed goes on being chemically etched by the $CH_4$ gas, it is possible to ensure an etching rate which was conventionally impossible to attain and it is possible to perform etching without causing damage to the first luminescent layer 4.

After the performing this etching, heat treatment of the luminescent layers 4 and 5 is performed under vacuum at 400° to 600° C.

Figure 4A:
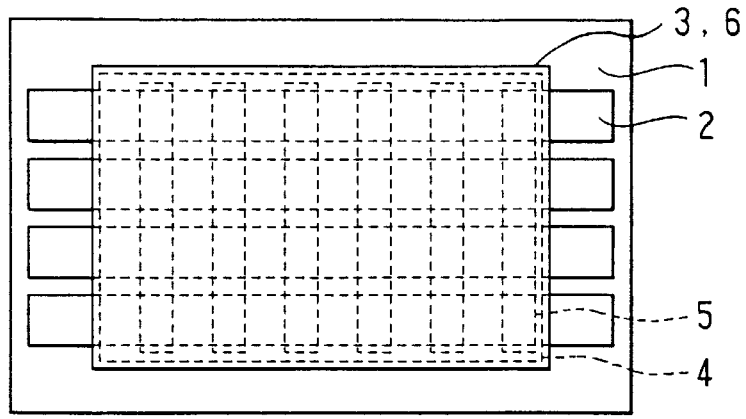
FIGS. 4A to 4C are plan views subsequent to FIG. 3C, illustrating the manufacturing method of manufacturing the EL element.
Figure 4B:
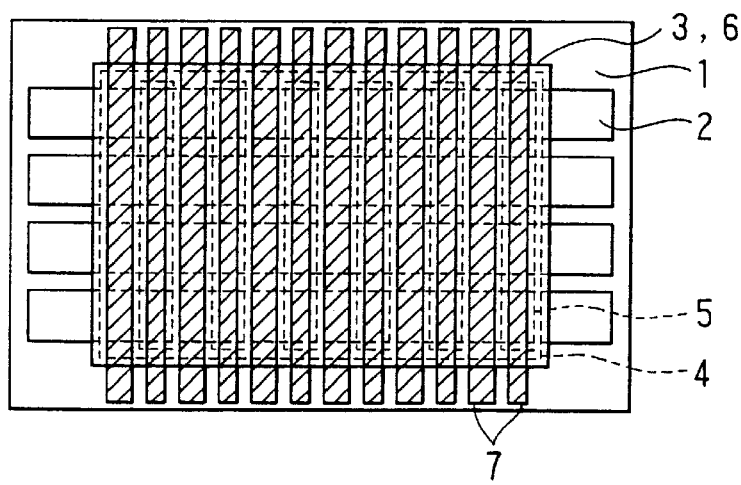

Next, as illustrated in FIG. 4A, on the first luminescent layer 4 and second luminescent layer 5 there are formed in the same manner as the formation of the first insulating layer 3 the second insulating lower layer 61 that consists of $Si_3N_4$, the second insulating intermediate layer 62 that consists of $Ta_2O_5$ containing $Al_2O_3$ of 6 wt % and the second insulating upper layer 63 that consists of $SiO_xN_y$, provided, however, that the $Si_3N_4$ film is formed without introducing the $O_2$ gas as the sputtering gas unlike the $SiO_xN_y$ film.

Next, on the second insulating upper layer 63, there is formed, uniformly, a layer that consists of $ZnO:Ga_2O_3$. As the evaporation material there is used a material that consists of a ZnO power having $Ga_2O_3$ added thereto, this mixture being formed into pellets. An ion plating device. Specifically, film formation is performed by, while maintaining the temperature of the glass substrate 1 to be at a fixed value, evacuating the interior of the ion plating device, thereafter introducing the Ar gas and maintaining the pressure thereof to be at a fixed value, and adjusting the beam power and high frequency power so that the film forming rate may fall within a range of 6 to 18 nm/min. By wet-etching this film, the second electrodes 7 are formed in a pattern illustrated in FIG. 4B.

Next, the red color filters 8 of organic pigment dispersed type are formed on the second electrodes 7 located on the regions having the second luminescent layers 5 thereunder. Specifically, a photo-resist that contains red color organic pigment is dropped in a prescribed amount onto each of the second electrodes 7, whereby a spinner resist coating is performed for several seconds.

Figure 4C:
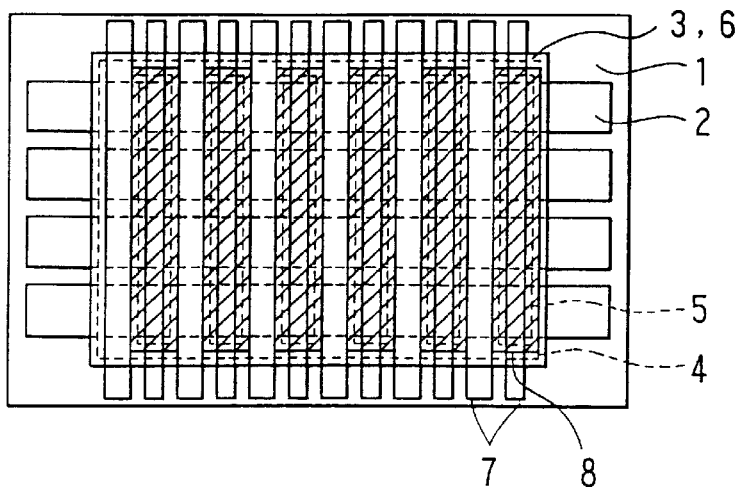

Thereafter, using a resist pattern having width that is larger than the width of the second luminescent layer 5, exposure and development are performed. Then, post-bake is done to thereby form the red color filter 8 as illustrated in FIG. 4C.

In this embodiment, the first luminescent layer 4 emits green light and the second luminescent layer 5 emits orange-yellow light. The light that has been emitted from a laminate portion of the first luminescent layer 4 and the second luminescent layer 5 transmits through the red color filters 8, with the result that a high color purity of red color light is obtained from the red color filters 8.

Note that the material of the first electrode 2, second electrode 7, first insulating layer 3 and second insulating layer 6 are not limited to the above-mentioned materials, and other materials may be used. For example, if an optically transparent ITO (Indium Tin Oxide) film is used as the first electrode 2, it is possible to take out light from the both surfaces of the EL element 100.

As the additive that is contained in the host material ZnS of the first luminescent layer 4 there can be used $MnF_2$ and $MnCl_2$ in addition to Mn. Also, as the additive that is contained in the host material ZnS of the second luminescent layer 5 there can be used TbOF, $TbF_3$ and $TbCl_3$ in addition to Tb.

Further, in the case of laminating the first and second luminescent layers, it may be arranged to pattern the first luminescent layer that becomes the lower layer and then form the second luminescent layer over an entire surface of the first luminescent layer. In this case, as a patterning technique for patterning the first luminescent layer, there can be used the above-mentioned dry etching that uses a mixed gas of $CH_4$ gas and Ar gas.

It is to be noted that the dry etching for the layer 15 that consists of ZnS and Mn can be performed also using a mixed gas of $CH_4$ gas, Ar gas and $H_2$ gas. Specifically, dry etching is performed by maintaining the temperature of the glass substrate 1 at 70° C., introducing a mixed gas of $CH_4$ gas, Ar gas and $H_2$ gas into a RIE device, maintaining the pressure at 7 Pa and using a high frequency power of 0.625 $W/cm^2$. In this case, the flowrates of $CH_4$ gas, Ar gas and $H_2$ gas are set at 2 sccm, 200 sccm and 20 sccm, respectively, and the percentage of the $H_2$ gas flowrate in the total gas flowrate is set at approximately 9%. By setting the etching conditions as such, etching can be performed at an etching rate of approximately 30 nm/min.

When the flowrate of the $CH_4$ gas has been increased, in order to obtain a desired etching rate, it is needed to make the ratio of the flowrate of the $H_2$ gas that is to be mixed high. For example, if the flowrate of the $CH_4$ gas has been set at 4 sccm, the flowrate of the $H_2$ gas is set at 40 sccm and the ratio of the flowrate of the $H_2$ gas to the flowrate of the total gas is set at around 16%. (Second Embodiment)

This second embodiment is that which has been prepared by applying the present invention to a blue color light emission EL element 200.

Figure 6:
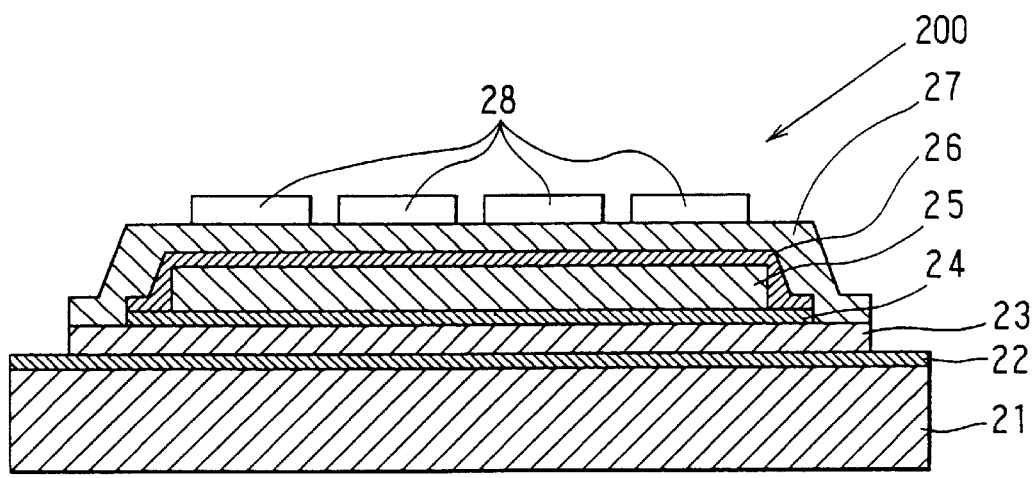
FIG. 6 is a typical sectional view illustrating the construction of an EL element according to a second embodiment of the present invention.

FIG. 6 is a typical view illustrating a longitudinal section of this EL element 200. In this EL element 200, a first electrode 22 that consists of ITO formed on transparent glass substrate 21. As in the case of the first embodiment, the first electrode 22 is formed such that a number of strips, each extending in the x-axial direction, are provided in the y-axial direction.

On the glass substrate 21, having the first electrode 22 formed thereon, there is formed, uniformly, a first insulating layer 23 which has the same construction as that of the first embodiment.

And, on the first insulating layer 23, there are uniformly formed, sequentially, a protective film 24 that consists of ZnS and has a thickness of 2000 Å and a luminescent layer 25 that has a thickness of 10000 Å.

The luminescent layer 25 is made of a sulfide of alkaline earth metal. When using, for example, SrS (strontium sulfide), the luminescent layer 25 can be made of SrS that has Ce added thereto. The luminescent layer 25 is formed by performing film formation by sputtering under the conditions that the glass substrate 21 is maintained at a fixed temperature of 500° C.; a SrS:Ce sintered material is used as the target; the gaseous pressure is 4.0 Pa; and the high frequency power is 2.4 KW (power density: 2.47 $W/cm^2$) and by, thereafter, performing heat treatment under vacuum at a temperature of 500° to 600° C.

The same protective film 26 as the protective film 24 is formed on the luminescent layer 25. A second insulating layer 27 which has the same construction as in the case of the first embodiment is uniformely formed on the protective film 26.

On the second insulating layer 27, there is formed a second electrode 28 that consists of an optically transparent material of $ZnO:Ga_2O_3$ and that has a thickness of 4500 Å. As in the case of the first embodiment, the second electrode 28 is formed such that a number of strips, each extending in the y-axial direction, are provided in the x-axial direction.

In this second embodiment, since the SrS material that is the host material of the luminescent layer 25 is weak for water components, it is impossible to form the second electrode 28 by wet etching unlike the first embodiment.

On this account, in this second embodiment, the second electrode 28 is formed in the following way. First, a layer that consists of ZnO:Ga$_2$O$_3$ is formed on the second electrode 27 to thereby form the second electrode 28 by patterning a posi-type resist thereon. The patterning method for patterning this resist is the same as illustrated in FIG. 5A.

In this state, dry etching is performed. In this case, the characteristic of the etching rate of ZnO relative to the flowrate of the CH$_4$ gas exhibits the same style as in the case of the ZnS material and, therefore, dry etching is performed using the same conditions as those in the first embodiment under which ZnS is etched. That is, dry etching is performed by maintaining the temperature of the glass substrate 21 70° C., introducing a mixed gas of CH$_4$ gas and Ar gas into an RIE device, maintaining the pressure at 7 Pa and using a high frequency power of 0.625 W/cm$^2$. Thereafter, the resist is removed. It is to be noted that in this dry etching no damage occurs in the second insulating layer 27 that is an underlying layer.

Additionally, if the blue color light emission EL element 200 that is explained in this second embodiment is constructed in such a manner as to overlap upon the EL element 100 of the first embodiment, it is possible to construct a full color EL display device.

Although in each of the above-mentioned first and second embodiments illustration has been made of an arrangement wherein a mixed gas of only CH$_4$ and Ar gases alone is used as the etching gas, another gas may be contained therein for some purpose or other. Also, another gas may be used as the inert gas. The inert gas is not limited to an Ar gas.

What is claimed is:

1. A dry etching method of performing dry etching of a material containing Zn, comprising:
   forming and patterning a resist on the material to be etched; and
   etching the material by using an etching gas which is a mixed gas of methane gas and inert gas and in which a percentage of the methane gas to a total of the methane gas and the inert gas is in a range of 0.5% to 5%, inclusive.

2. A dry etching method as set forth in claim 1, wherein the percentage of the methane gas is in a range of 0.5% to 2%, inclusive.

3. A dry etching method as set forth in claim 2, wherein a high frequency power that is used when the etching is performed is made to fall within a range of 0.25 W inclusive to 0.8 W per square centimeter.

4. A dry etching method as set forth in claim 2, wherein a pressure of the etching gas is within a range of from 30 mTorr to 100 mTorr inclusive.

5. A dry etching method as set forth in claim 1, wherein the mixed gas consists of only the methane gas and the inert gas alone.

6. A dry etching method as set forth in claim 1, wherein the inert gas is argon gas.

7. A dry etching method as set forth in claim 1, wherein the material to be etched is made of a material that consists mainly of zinc sulfide or zinc oxide.

8. A dry etching method of performing dry etching of a material containing Zn, comprising:
   etching the material by using an etching gas that consists of only methane gas, inert gas and hydrogen gas alone.

9. A dry etching method of performing dry etching of a material containing Zn, comprising:
   introducing an etching gas that contains methane gas, inert gas and hydrogen gas into a dry etching device, a flowrate of the hydrogen gas being set at a flowrate equal to or greater than a value at which an amount of dissociated hydrogen therefrom becomes saturated; and
   etching the material by using the etching gas.

10. An EL element manufacturing method in which a first electrode, first insulating layer, luminescent layer using a material containing zinc therein as a host material, second insulating layer and second electrode are sequentially laminated on an insulating substrate, comprising:
    forming and patterning a resist on the luminescent layer; and
    etching the luminescent layer by using an etching gas which is a mixed gas of methane gas and an inert gas.

11. An EL element manufacturing method as set forth in claim 10, wherein the luminescent layer is formed by laminating a first luminescent layer and a second luminescent layer, whereby with the first luminescent layer being located as an underlying layer the second luminescent layer is patterned by the step of etching the luminescent layer.

12. An EL element manufacturing method as set forth in claim 10, wherein a percentage of the methane gas to a total of the methane gas and the inert gas is in a range of 0.5% to 5%, inclusive.

13. An EL element manufacturing method as set forth in claim 10, wherein a percentage of the methane gas to a total of the methane gas and the inert gas is in a range of 0.5% to 2%, inclusive.

14. An EL element manufacturing method as set forth in claim 10, wherein the mixed gas consists of only the methane gas and the inert gas alone.

15. An EL element manufacturing method as set forth in claim 10, wherein the inert gas is argon gas.

16. An EL element manufacturing method as set forth in claim 10, wherein the etching gas contains hydrogen gas in addition to the methane gas and the inert gas.

17. An EL element manufacturing method as set forth in claim 16, wherein a flowrate of the hydrogen gas is set equal to or greater than a value at which an amount of dissociated hydrogen therefrom becomes saturated.

18. An EL element manufacturing method in which a first electrode, first insulating layer, luminescent layer, second insulating layer and second electrode are sequentially laminated on an insulating substrate, comprising;
    forming the second electrode on the second insulating layer by using a material that consists mainly of zinc oxide;
    forming and patterning a resist on the second electrode; and
    etching the second electrode by using an etching gas which is a mixed gas of methane gas and inert gas.

19. An EL element manufacturing method as set forth in claim 18, wherein the luminescent layer is made of a material that consists mainly of a sulfide of an alkaline earth metal.

20. An EL element manufacturing method as set forth in claim 18, wherein a percentage of the methane gas to a total of the methane gas and the inert gas is in a range of 0.5% to 5%, inclusive.

21. An EL element manufacturing method as set forth in claim 18, wherein a percentage of the methane gas to a total of the methane gas and the inert gas is in a range of 0.5% to 2%, inclusive.

22. An EL element manufacturing method as set forth in claim 18, wherein the mixed gas consists of only the methane gas and the inert gas alone.

23. An EL element manufacturing method as set forth in claim 18, wherein the inert gas is argon gas.

24. An EL element manufacturing method as set forth in claim 18, wherein the etching gas contains hydrogen gas in addition to the methane gas and the inert gas.

25. An EL element manufacturing method as set forth in claim 24, wherein a flowrate of the hydrogen gas is set equal to or greater than a value at which an amount of dissociated hydrogen therefrom becomes saturated.

26. An EL element manufacturing method in which a first electrode, first insulating layer, luminescent layer, second insulating layer and second electrode are sequentially laminated on an insulating substrate, said luminescent layer being composed of at least two kinds of different-color luminescent layers, said EL element manufacturing method comprising:

forming a first luminescent material that has zinc in its composition on the first insulating layer;

forming a first resist having a first pattern on the first luminescent material;

dry-etching the first luminescent material through the first resist to thereby form the first luminescent layer having the first pattern;

forming a second luminescent material that has zinc in its composition on the first luminescent layer;

forming on the second luminescent material a second resist that has a second pattern that is different from the first pattern of the first resist; and dry-etching the second luminescent material through the second resist to thereby form the second luminescent layer that has the second pattern, wherein at least one of the dry-etchings is performed in an atmosphere of an etching gas which is a mixed gas of methane gas and inert gas and in which the percentage of the methane gas to a total of the methane gas and the inert gas is from 0.5% to 5%. inclusive.

27. An EL element manufacturing method as set forth in claim 26, wherein the percentage of the methane gas falls within a range of from 0.5% to 1.5%, inclusive.

28. An EL element manufacturing method as set forth in claim 26, wherein a high frequency power that is used when the step of dry-etching is performed by using the mixed gas is made to fall within a range of 0.55 W to 0.7 W per square centimeter, inclusive.

29. An EL element manufacturing method as set forth in claim 26, wherein a pressure of the etching gas is within a range of from 40 mTorr to 65 mTorr, inclusive.

30. An EL element manufacturing method as set forth in claim 26, wherein a difference of an etching rate at which the resist is etched from an etching rate at which the luminescent material is etched is 5 nm/min or more.

31. An EL element manufacturing method as set forth in claim 26, wherein a difference of an etching rate at which the resist is etched from an etching rate at which the luminescent material is etched is 10 nm/min or more.

* * * * *